US007633755B2

(12) United States Patent
Zhou et al.

(10) Patent No.: US 7,633,755 B2
(45) Date of Patent: *Dec. 15, 2009

(54) HEAT DISSIPATION DEVICE ASSEMBLY WITH A FAN DUCT HAVING GUIDING MEMBERS FOR GUIDING A SCREWDRIVER TO ASSEMBLE THE HEAT DISSIPATION DEVICE ASSEMBLY TO A PRINTED CIRCUIT BOARD

(75) Inventors: Shi-Wen Zhou, Shenzhen (CN); Jun Cao, Shenzhen (CN); Jie-Cheng Deng, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 53 days.

This patent is subject to a terminal disclaimer.

(21) Appl. No.: 11/940,937

(22) Filed: Nov. 15, 2007

(65) Prior Publication Data
US 2009/0129018 A1 May 21, 2009

(51) Int. Cl.
*H05K 7/20* (2006.01)
(52) U.S. Cl. .................. 361/697; 361/695; 174/16.3; 165/80.3

(58) Field of Classification Search .............. None
See application file for complete search history.

(56) References Cited

U.S. PATENT DOCUMENTS

| | | | | |
|---|---|---|---|---|
| 5,936,836 A | * | 8/1999 | Scholder | 361/695 |
| 6,288,898 B1 | * | 9/2001 | Johnson et al. | 361/687 |
| 7,120,019 B2 | * | 10/2006 | Foster et al. | 361/695 |
| 7,314,027 B2 | * | 1/2008 | Murata | 123/90.16 |
| 7,363,963 B2 | * | 4/2008 | Wang et al. | 165/80.3 |
| 7,428,153 B2 | * | 9/2008 | Tan et al. | 361/700 |
| 7,443,676 B1 | * | 10/2008 | Li | 361/700 |
| 7,447,020 B2 | * | 11/2008 | Xia et al. | 361/695 |
| 7,495,913 B1 | * | 2/2009 | Liu et al. | 361/697 |
| 2007/0000645 A1 | * | 1/2007 | Tung et al. | 165/104.26 |
| 2008/0101018 A1 | * | 5/2008 | Long et al. | 361/695 |

\* cited by examiner

*Primary Examiner*—Boris L Chervinsky
(74) *Attorney, Agent, or Firm*—Frank R. Niranjan

(57) ABSTRACT

A heat dissipation device assembly for dissipating heat from a plurality of electronic components mounted on a printed circuit board, includes a heat sink (10) contacting one of the electronic components, a pair of fans (20) attached on a lateral side of the heat sink, and a fan duct (30) fixed on the fans. A plurality of guiding members (322, 346) are formed inwardly from the fan duct to be located in an interior of the fan duct. The guiding members are used for guiding a screwdriver (40) to accurately fit with screws (50) preassembled to the heat sink. Thus, the screws can be quickly and easily fastened by the screwdriver to mount the heat dissipation device assembly on the printed circuit board.

20 Claims, 4 Drawing Sheets

HEAT DISSIPATION DEVICE ASSEMBLY WITH A FAN DUCT HAVING GUIDING MEMBERS FOR GUIDING A SCREWDRIVER TO ASSEMBLE THE HEAT DISSIPATION DEVICE ASSEMBLY TO A PRINTED CIRCUIT BOARD

BACKGROUND OF THE INVENTION

1. Field of the Invention

The present invention relates to a heat dissipation device assembly, and more particularly to a heat dissipation device assembly incorporating a fan duct that has guiding members for facilitating an assembly of the heat dissipation device assembly to a printed circuit board by using a screwdriver.

2. Description of Related Art

The central processing unit (CPU) mounted on the motherboard in a computer is the center of operations of the computer. During the operations of the computer, the CPU produces heat. The heat must be quickly carried away from the CPU during the operations of the computer. A heat dissipation device assembly is used to remove the heat from the CPU.

Typically, a heat dissipation device assembly comprises a heat sink, a fan and a fan duct, wherein the heat sink is for contacting an electronic component mounted on a printed circuit board. The heat sink has a plurality of screws preassembled thereto. The fan and the fan duct are also preassembled on the heat sink to construct an integral combination before the heat dissipation device assembly is screwed to the printed circuit board, whereby a user or an assembler can easily and readily mount the heat dissipation device assembly to the printed circuit board. What the assembler or user needs to do to fix the assembly to the printed circuit board is only to use a screwdriver to fasten the screws to the printed circuit board.

Since the screws are located in an interior of the fan duct, the user or assembler needs to bring the screwdriver to extend through the fan duct to reach the screws. However, it is difficult to realize an accurate and quick fitting of the screwdriver to the screws, because a sight of the screws is blocked by the fan duct and the screwdriver is relatively long. Thus, it is almost impossible for the user or assembler to quickly fasten the conventional heat dissipation device assembly to the printed circuit board. Usually, the user or assembler needs to relocate the position of a tip of the screwdriver one or two times before the tip can fit into a groove in a head of a corresponding screw.

What is needed, therefore, is a heat dissipation device assembly which can overcome the above-mentioned disadvantage.

SUMMARY OF THE INVENTION

A heat dissipation device assembly for dissipating heat from a plurality of electronic components mounted on a printed circuit board is disclosed; the heat dissipation device assembly includes a heat sink contacting one of the electronic components, a pair of fans attached on a lateral side of the heat sink, and a fan duct fixed on the fans. A plurality of guiding members are formed inwardly from the fan duct to be located in an interior of the fan duct. The guiding members are used for guiding a screwdriver to extend though the fan duct to accurately fit with screws of the assembly, thus realizing a convenient assembly between the heat dissipation device assembly and the printed circuit board by operating the screwdriver to fasten the screws to the printed circuit board.

Other advantages and novel features of the present invention will become more apparent from the following detailed description when taken in conjunction with the accompanying drawings, in which:

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
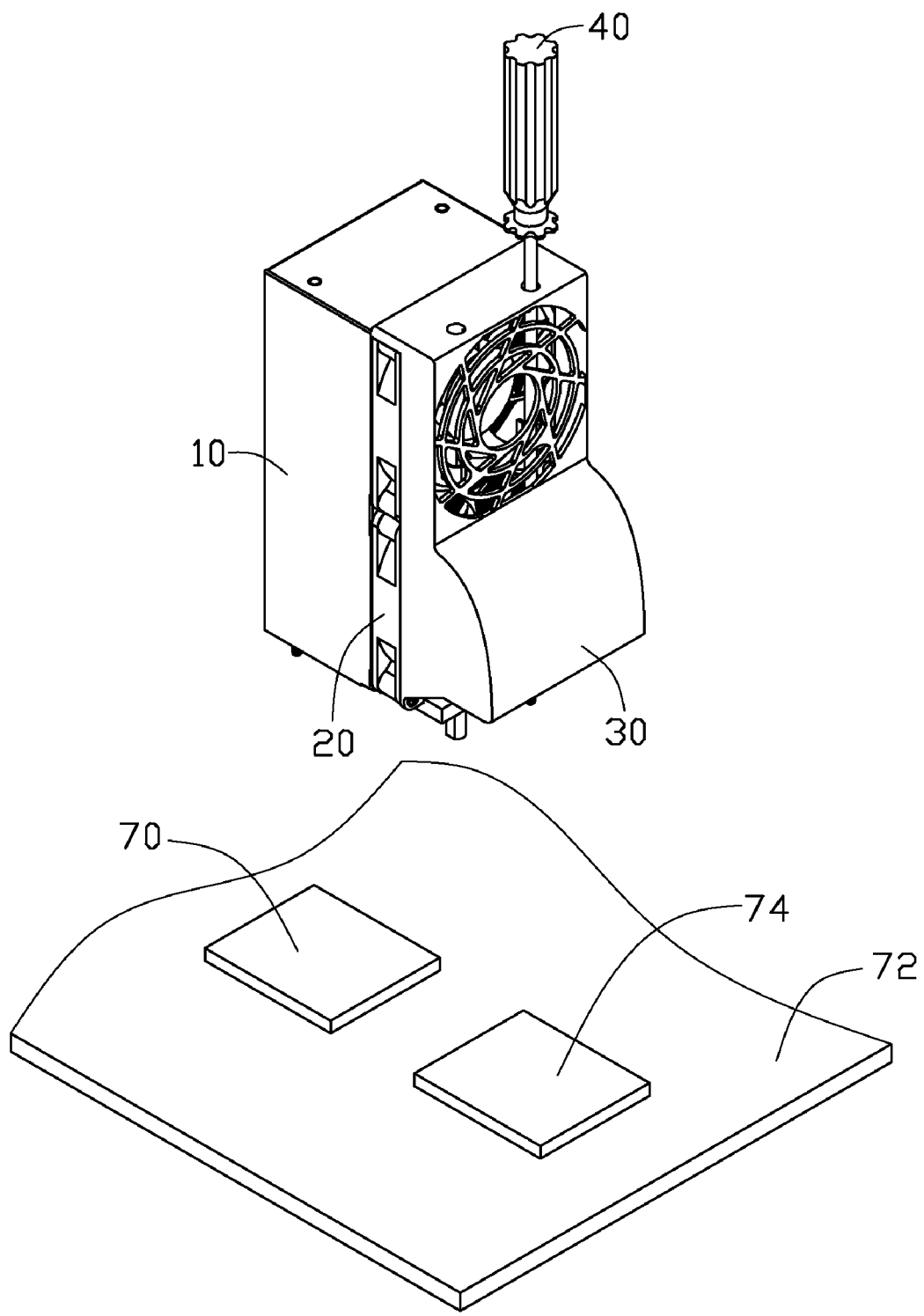
FIG. 1 is an assembled, isometric view of a heat dissipation device assembly in accordance with a preferred embodiment of the present invention with a screwdriver inserted in a fan duct, wherein a printed circuit board having two electronic components mounted thereon is placed below the heat dissipation device assembly.

Referring to FIG. 1, a heat dissipation device assembly of a preferred embodiment of the present invention comprises a heat sink 10 for contacting an electronic component 70 mounted on a printed circuit board 72, a pair of fans 20 fixed on the heat sink 10, and a fan duct 30 fastened to the fans 20.

Figure 2:
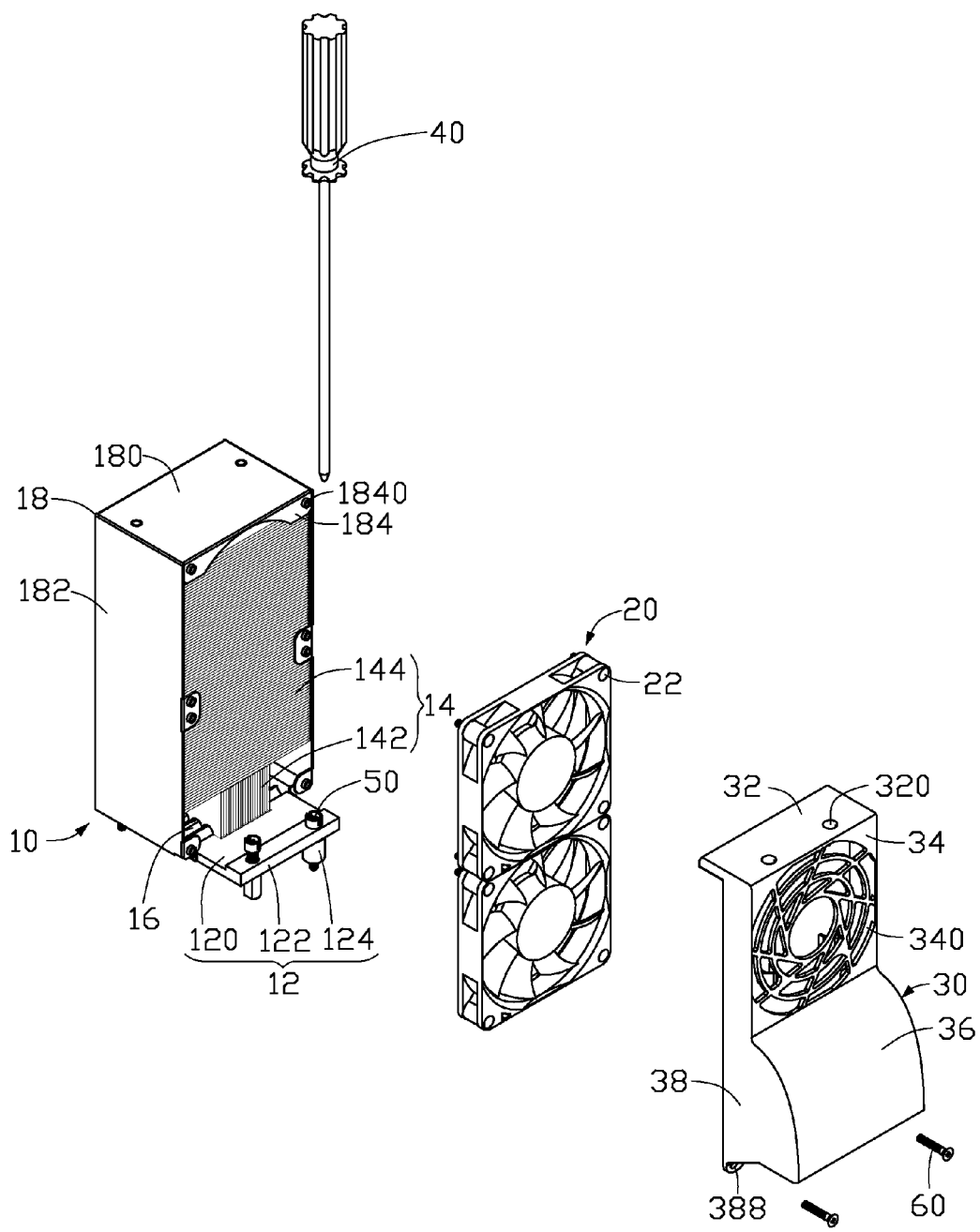
FIG. 2 is a partly exploded view of FIG. 1 with the screwdriver detached from the fan duct.
Figure 4:
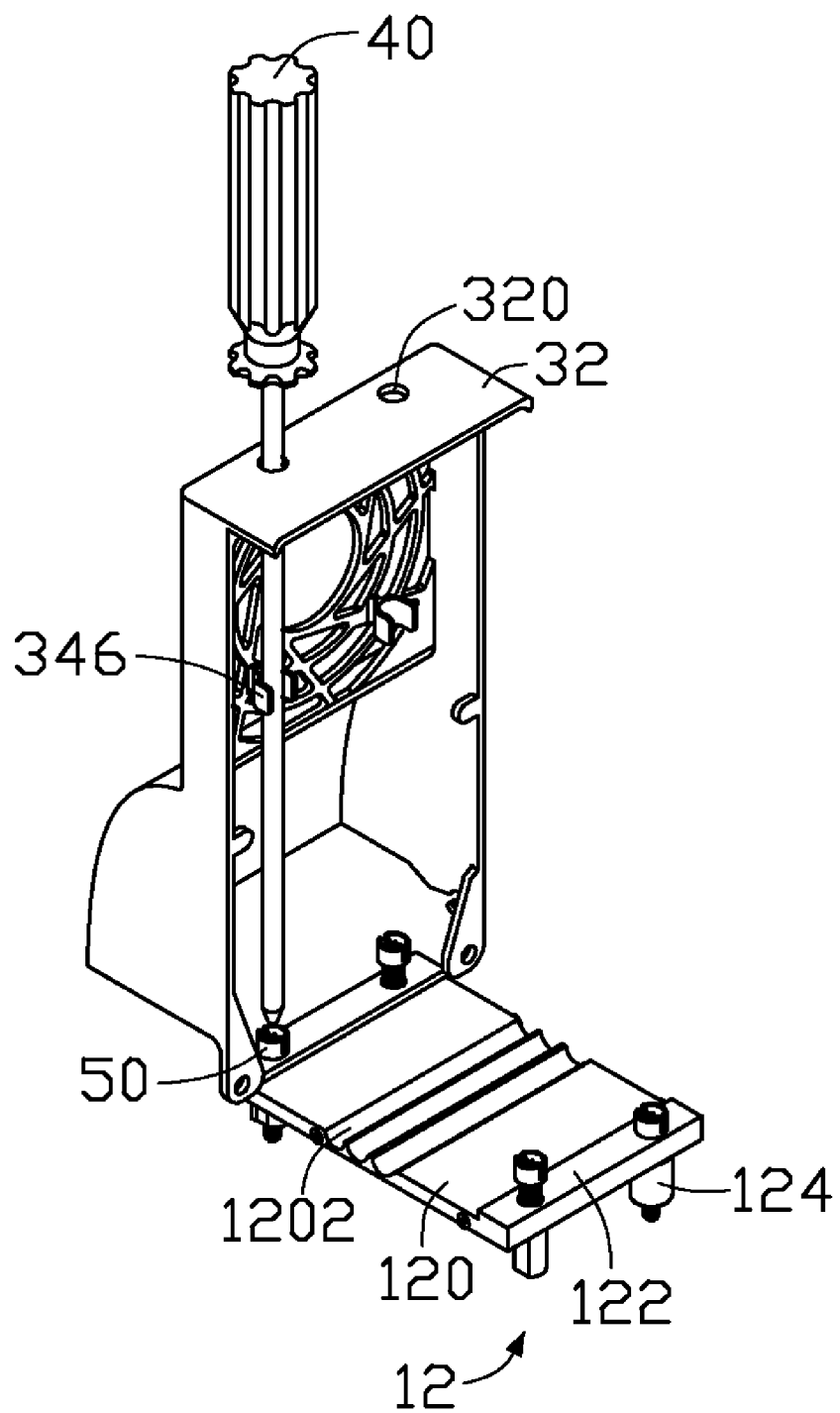
FIG. 4 is a view similar to FIG. 1 but from a different aspect, wherein a part of a heat sink and a pair of fans of the assembly are removed for clarity.

As shown in FIG. 2, the heat sink 10 comprises a base 12, a plurality of fins 14 attached to the base 12, a plurality of heat pipes 16 extending through the fins 14, and an enclosure 18 receiving the fins 14 therein. As illustrated in FIG. 4, the base 12 comprises a rectangular plate 120 having a bottom face for contacting the electronic component 70, a pair of rectangular protrusions 122 projecting upwardly and perpendicularly from two lateral sides of a top face of the plate 120 respectively, and four locking feet 124 extending downwardly and vertically from the bottom face at four corners of the plate 120. Three parallel grooves 1202 are defined at the top face of the plate 120 for accommodating the heat pipes 16. The pair of protrusions 122 define four through holes (not labeled) which extend through the locking feet 124 respectively. Four screws 50 are preassembled loosely in the through holes of the base 12, respectively. Referring to FIG. 2 again, the fins 14 comprise first fins 142 vertically attached on the top face of the plate 120, and second fins 144 perpendicularly fixed on the first fins 142 to be spaced a distance from the base 12 by the first fins 142. The fins 14 each are substantially rectangular shaped, wherein each of the second fins 144 has an area larger than that of each of the first fins 142. The heat pipes 16 each having two ends to extend through two lateral sides of the second fins 144, and a middle section sandwiched between a bottom of the first fins 142 and the base 12 so as to be accommodated in the grooves 1202, thereby enhancing a heat dissipation efficiency of the heat sink 10. The enclosure 18 comprises a top plate 180 parallel to the plate 120 of the base 12, and a pair of lateral plates 182 formed downwardly and perpendicularly from two lateral sides of the top plate 180. The lateral plates 182 of the enclosure 18 sandwich the fins 14 therebetween, and the top plate 180 is disposed above the fins 14, thereby enabling the enclosure 18 to enclose the fins 14. A plurality of flanges 184 extends inwardly and vertically from a periphery of the enclosure 18 at a front side of the heat sink 10, wherein one of the flanges 184 with an arced cutout (not labeled) defined at a central area thereof is located at a top of the lateral plates 182 and connects the top plate 180, other two of the flanges 184 are located at middles of the lateral plates 182, and remaining two flanges 184 are located at bottoms of the lateral plates 182, respectively. The flanges 184 form a plurality of screw supports 1840 thereon, which are used for engaging with screws (not shown) to attach the fans 20 to the heat sink 10.

The fans 20 are axial fans. Each of the fans 20 has a substantially square shape with four through holes 22 defined at four corners thereof, corresponding to four of the screw supports 1840 of the heat sink 10. The fans 20 are attached to the front face of the heat sink 10 side by side in a manner such that one of the fans 20 is located at a lower position and another one of the fans 20 is located at an upper position along a height direction of the heat sink 10. Six screws (not shown) are brought to extend through upper six through holes 22 of the fans 20 to threadedly engage in corresponding screw supports 1840 of the heat sink 10, thereby securing the fans 20 to the heat sink 10 firmly.

Figure 3:
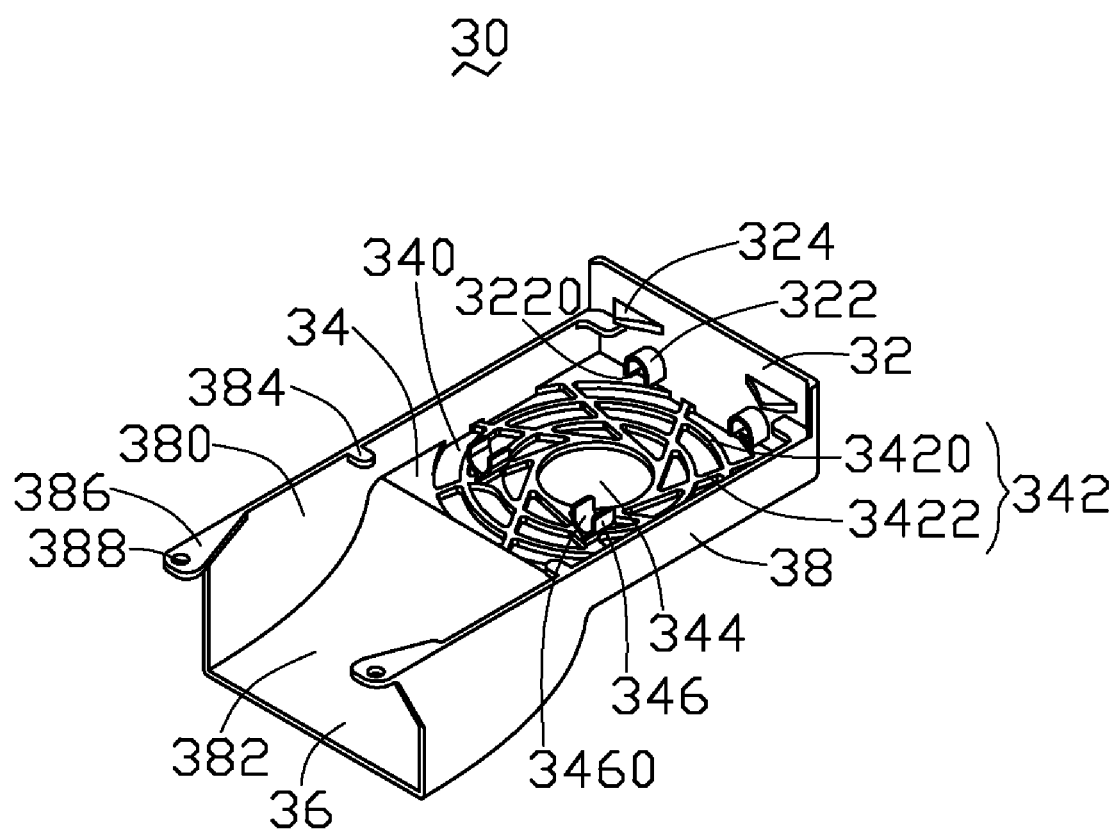
FIG. 3 is an isometric view of the fan duct of FIG. 1, viewed from a different aspect.

The fan duct 30 comprises a rectangular top plate 32, a front plate 34 extending downwardly and perpendicularly from a front side of the top plate 32, an arc-shaped baffle plate 36 formed downwardly from a bottom side of the front plate 34, and a pair of lateral plates 38 extending downwardly and perpendicularly from two lateral sides of the top plate 32. The front plate 34 fronts an upper fan 20, and the baffle plate 36 fronts a lower fan 20. The top plate 32 is parallel to the plate 120 of the base 12 and defines a pair or through holes 320 at two lateral sides thereof for providing passages of a screwdriver 40 therethrough. Referring to FIG. 3, a pair of guiding members 322 are formed downwardly and vertically from the top plate 32 and located an interior of the fan duct 30 respectively. Each of the guiding members 322 comprises a U-shaped wall (not labeled) having an arced portion (not labeled) coincidental with a portion of a periphery of a corresponding through hole and two side portions extending from the arced portion to connect with the front plate 34. Accordingly, a space defined in each guiding member 322 is opened towards the front plate 34. A guiding groove 3220 is defined by the arced portion of the guiding member 322, which is in line with a corresponding through hole 320. A pair of triangle tabs 324 project downwardly and perpendicularly from a bottom face at two lateral sides of the top plate 32 and near the guiding members 322 so as to engage in the fans 20. The tabs 324 are used for engaging in recesses (not labeled) defined in a top surface of the upper one of the fans 20, thereby to more firmly attach the fan duct 30 to the fans 20. The front plate 34 is oriented parallel to the front face of the heat sink 10 and defines a first inlet 340 in a central area thereof 44 for providing an entry of an airflow into the upper one of the fans 20. The airflow flows through the first inlet 340 in a direction perpendicular to the front plate 34. A protective cage 342 is formed inwardly from a periphery of the first inlet 340 for covering the first inlet 340, thus preventing an operator from injury by carelessly touching blades (not labeled) of an impeller (not labeled) of the upper one of the fans 20 when the fans 20 are in operation. The protective cage 342 defines a central hole 344 in alignment with a hub (not labeled) of the impeller of the upper fan 20 (shown in FIG. 2). The protective cage 342 comprises a plurality of annular strips 3420 concentrically surrounding the hole 344, and a plurality of elongated strips 3422 slantwise interconnecting the annular strips 3420 in such a manner that the elongated strips 3422 are arranged in volute respective to the hole 344. A pair of guiding members 346 are formed inwardly and perpendicularly from the protective cage 342 to be located in the interior of the fan duct 30. Each of the guiding members 346 has a U-shaped configuration and comprises an arced portion (not labeled) attached to the cage 342 via a cuboidal seat (not labeled) and two side portions (not labeled) extending inwardly from the arced portion. Thus, each guiding member 346 defines an inner spaced (not labeled) opened away from the front plate 34. A guiding groove 3460 is defined in each arced portion of the guiding member 346, which is linear with a corresponding guiding groove 3220 and a corresponding through hole 320. The through holes 320, the guiding grooves 3220, and the guiding grooves 3460 cooperate for guiding the screwdriver 40, to fit with the screws 50 (shown in FIG. 4). The baffle plate 46 has a curved, downwardly gradually expanding configuration to define an outward, downwardly gradually enlarging port (not labeled) for the airflow. The lateral plates 38 couple the top plate 32 with the front plate 34 and the baffle plate 36 in such a manner that the lateral plates 38 and the top plate 32 cooperate to define a rectangular outlet 380 of the airflow that has an area similar to that the fans 20 occupy. The lateral plates 38 and the baffle plate 36 cooperatively enclose a rectangular second inlet 382 of the airflow. The lateral plates 38 are oriented perpendicular to the top plate 32 and the front plate 34, so that the airflow flowing through the second inlet 382 is perpendicular to the top plate 32 and the airflow flowing through the outlet 380 is perpendicular to the front plate 34. The second inlet 382 and the first inlet 340 communicate with the outlet 380 for providing two passages to the airflow through the fan duct 30. The top plate 32 has a rear portion extending beyond the lateral plates 38 for forming the triangle tabs 324 located behind the outlet 380 of the fan duct 30. Four flanges 384 extend inwardly and perpendicularly from peripheries of the lateral plates 38 at the outlet 380 of the fan duct 30, wherein two flanges 384 connect the top plate 32, and other two flanges 384 are located at middles of the lateral plates 38 respectively. A pair of engaging tabs 386 are bent inwardly and perpendicularly from bottoms of the lateral plates 38 at the outlet 380 and adjacent to the second inlet 382 of the fan duct 30. The engaging tabs 386 are coplanar with the flanges 384 and parallel to the front plate 34 with a through hole 388 defined in each of the engaging tabs 386. Also referring to FIGS. 2-3, the triangle tabs 324 are for being inserted into a top portion of the upper fan 20 to hold the top plate 32 to cover the upper fan 20. The flanges 384 are glued to the fans 20 at positions corresponding to the upper six holes 22 of the fans 20, and the engaging tabs 388 are secured to the lower fan 20 by bringing a pair of screws 60 to extend through the holes 388 of the fan duct 30 and two lower through holes 22 of the lower fan 20 to threadedly engage in two corresponding screw supports 1840 of the heat sink 10. Thus, the fan duct 30 is securely attached to the fans 20, in which the outlet 380 is oriented towards and adjacent to the fans 20. The first inlet 340 and the second inlet 382 are spaced from the fans 20 via the outlet 380 in a manner such that the first inlet 340 is located in front of the upper fan 20, and the second inlet 382 is located beneath the lower fan 20 and above the protrusion 122 of the base 12 and oriented towards another electronic component 74 on the printed circuit board 72.

Referring to FIGS. 2-4, guiding slots consisting of the through holes 320 and the guiding grooves 3220, 3460 of the fan duct 30 are in line with corresponding screws 50 that have been preassembled in the heat sink 10 (illustrated in FIG. 4), whereby when the screwdriver 40 is brought to extend through each of the through holes 320 of the top plate 32 of the fan duct 30, it will be guided to move downwardly towards the corresponding screw 50 along the guiding grooves 3220, 3460, so as to realize an accurate fitting of the tip of the screwdriver 40 with the corresponding screw 50. Then the corresponding screw 50 is screwed by rotating the screwdriver 40 to threadedly engage with the printed circuit board; therefore, the heat dissipation device assembly is firmly mounted on the printed circuit board. As the heat dissipation device assembly is mounted on the printed circuit, the bottom face of the rectangular plate 120 of the base 12 is in intimate contact with the electronic component mounted on the printed circuit board.

In use, the heat generated by the electronic component is conducted to the heat sink 10. As rotations of the impellers of the fans 20, a part of the airflow is drawn to flow via the first inlet 340 of the fan duct 30 by the upper fan 20, and pass through the outlet 380 to blow an upper portion of the heat sink 10, thereby to remove heat in the heat sink 10 from the electronic component. Another part of the airflow is driven into the fan duct 30 via the second inlet 382 by the lower fan 20 for cooling the another electronic component on the printed circuit board. Moreover, the another part of the airflow is reflected by the baffle plate 36 of the fan duct 30 and drawn by the lower fan 20 into a lower portion of the heat sink 10, thereby blowing the lower portion of the heat sink 10. Thus, the heat in the heat sink 10 from the electronic component is also taken away by the another part of the airflow. Therefore, the airflow generated by the fans 20 can be guided by the fan duct 30 to cool a plurality of electronic components on the printed circuit board simultaneously.

According to the above description, even if a sight of the screws 50 is blocked by the fan duct 30, the screwdriver 40 still can easily to accurately reach the screws 50 by the guidance of the guiding slots in the interior of the fan duct 30; thus, the assembly between the heat dissipation device assembly and the printed circuit board can be conveniently, easily and quickly completed.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device assembly adapted for dissipating heat generated by a plurality of electronic components mounted on a printed circuit board, the heat dissipation device assembly comprising:
 a heat sink adapted for absorbing the heat from one of the plurality of electronic components, said heat sink having a plurality of screws preassembled thereto;
 a fan being mounted on a lateral side of the heat sink; and
 a fan duct being secured to the fan and sandwiching the fan between the heat sink and the fan duct, the fan duct comprising a top plate, a pair of lateral plates extending downwardly from two lateral sides of the top plate, and a cover coupling the top plate with the pair of lateral plates, guiding means being formed on the cover and located in an interior of the fan duct, adapted for guiding a screwdriver to extend through the interior of the fan duct to reach and fit with a corresponding screw, thus realizing a convenient and quick assembly between the heat dissipation device assembly and the printed circuit board by operating the screwdriver to fasten the corresponding screw to the printed circuit board.

2. The heat dissipation device assembly as claimed in claim 1 further comprising an additional fan, wherein the additional fan is attached on the lateral side of the heat sink and located above the fan.

3. The heat dissipation device assembly as claimed in claim 2, wherein the cover comprises a front plate extending downwardly from a front side of the top plate, and a curved baffle plate formed from a bottom side of the front plate.

4. The heat dissipation device assembly as claimed in claim 3, wherein the front plate of the fan duct is located in front of the additional fan and the baffle plate is located in front of the fan, the front plate defining a first inlet therein for providing an entry of an airflow into the fan duct.

5. The heat dissipation device assembly as claimed in claim 4, wherein the top plate and the lateral plates cooperatively define an outlet for providing an exit of the airflow away from the fan duct, and the baffle plate and the lateral plates cooperatively enclose a second inlet for providing another entry of the airflow into the fan duct.

6. The heat dissipation device assembly as claimed in claim 5, wherein the first inlet and the second inlet communicate with the outlet of the fan duct, the airflow flowing through the first inlet being parallel to the airflow flowing through the outlet and perpendicular to the airflow flowing through the second inlet.

7. The heat dissipation device assembly as claimed in claim 5, wherein the outlet of the fan duct is oriented towards the heat sink that contacts the one of the plurality of electronic components, the second inlet of the fan duct is spaced from the heat sink via the outlet and oriented to another one of the plurality of electronic components, thus allowing the heat dissipation device assembly to cool the plurality of electronic components simultaneously.

8. The heat dissipation device assembly as claimed in claim 5, wherein the lateral plates are oriented parallel to each other, and perpendicular to the top plate and the front plate, the top plate being perpendicular to the front plate.

9. The heat dissipation device assembly as claimed in claim 5, wherein the guiding means includes a pair of through holes defined at two lateral sides of the top plate for providing passages to the screwdriver into the interior of the fan duct, and a pair of U-shaped guiding members being formed downwardly from the top plate into the interior of the fan duct, each U-shaped guiding member having an arced portion coincidental with a portion of a periphery of a corresponding through hole.

10. The heat dissipation device assembly as claimed in claim 9, wherein each of the pair of guiding members has two side portions extending from the arced portion to connect with the front plate, the arced portion defining a guiding groove in line with a corresponding through hole, adapted for guiding the screwdriver to move in the interior of the fan duct to reach the corresponding screw.

11. The heat dissipation device assembly as claimed in claim 10, wherein a protective cage is formed in the first inlet of the fan duct, the protective cage comprising a plurality of annular strips concentric with each other, and a plurality of elongated strips radially interconnecting the annular strips.

12. The heat dissipation device assembly as claimed in claim 11, wherein the guiding means further includes a pair of additional guiding members formed inwardly from the protective cage of the fan duct to be located in the interior of the fan duct, and each of the additional guiding members has a U-shaped configuration and opened toward a direction away from the front plate.

13. The heat dissipation device assembly as claimed in claim 5, wherein the top plate has a rear portion extending beyond the lateral plates to cover the additional fan, a pair of tabs being formed downwardly from the bottom face of the rear portion of the top plate for being inserted into the additional fan.

14. The heat dissipation device assembly as claimed in claim 5, wherein a plurality of flanges and engaging tabs extends inwardly from peripheries of the lateral plates at the outlet of the fan duct, the plurality of flanges and engaging tabs being coplanar with each other for securing the fan duct to the fan and the additional fan.

15. A heat dissipation device assembly comprising:
   a heat sink has a base for contacting with an electronic component, a plurality of fins stacked on the base and a plurality of screws preassembled to the base;
   at least a fan mounted to the heat sink and located on the base for generating an airflow through the fins; and
   a fan duct mounted on the at least a fan, having through holes in a top wall and guiding members in an interior thereof, the through holes and the guiding members are being in line with the screws, respectively, whereby a screwdriver can be inserted through one of the through holes and a corresponding guiding member to reach and fit with a corresponding screw to thereby quickly fasten the corresponding screw.

16. The heat dissipation device assembly as claimed in claim 15, wherein the fan duct defines an upper airflow entrance which is oriented horizontally and a lower airflow entrance which is oriented vertically.

17. The heat dissipation device assembly as claimed in claim 16, wherein the guiding members each are U-shaped with an arced portion defining a guiding groove in line with a corresponding through hole.

18. The heat dissipation device assembly as claimed in claim 15, wherein one of the guiding members is extended from the top wall into the interior of the fan duct.

19. The heat dissipation device assembly as claimed in claim 18, wherein another one of the guiding members is extended from a front wall connected to the top wall into the interior of the fan duct.

20. The heat dissipation device assembly as claimed in claim 19, wherein the front wall is perpendicular to the top wall, a protective cage being formed in the front wall.

* * * * *